(12) United States Patent
Lochtefeld et al.

(10) Patent No.: US 6,849,508 B2
(45) Date of Patent: Feb. 1, 2005

(54) METHOD OF FORMING MULTIPLE GATE INSULATORS ON A STRAINED SEMICONDUCTOR HETEROSTRUCTURE

(75) Inventors: Anthony Lochtefeld, Cambridge, MA (US); Mayank Bulsara, Cambridge, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/165,014

(22) Filed: Jun. 7, 2002

(65) Prior Publication Data

US 2003/0013287 A1 Jan. 16, 2003

Related U.S. Application Data

(60) Provisional application No. 60/296,617, filed on Jun. 7, 2001.

(51) Int. Cl.[7] .................... H01L 21/335; H01L 21/8234
(52) U.S. Cl. ....................................... 438/275
(58) Field of Search ................. 438/275, FOR 193, 438/259, 241, 200

(56) References Cited

U.S. PATENT DOCUMENTS

| | | | | |
|---|---|---|---|---|
| 4,471,373 A | | 9/1984 | Shimizu et al. ............... 357/41 |
| 4,525,811 A | | 7/1985 | Masuoka .................... 365/154 |
| 4,806,500 A | | 2/1989 | Scheibe ....................... 437/57 |
| 5,239,195 A | | 8/1993 | Compagne .................. 257/360 |
| 5,442,205 A | | 8/1995 | Brasen et al. ............... 257/191 |
| 5,576,573 A | * | 11/1996 | Su et al. ...................... 257/391 |
| 5,723,355 A | * | 3/1998 | Chang et al. ............... 438/275 |
| 5,989,962 A | * | 11/1999 | Holloway et al. .......... 438/275 |
| 6,025,234 A | * | 2/2000 | Chou ........................ 438/279 |
| 6,303,521 B1 | * | 10/2001 | Jenq ........................... 438/770 |
| 6,429,098 B1 | * | 8/2002 | Bensahel et al. ........... 438/478 |
| 6,465,323 B1 | * | 10/2002 | Yu et al. ..................... 438/424 |
| 6,472,327 B2 | * | 10/2002 | Ko et al. .................... 438/704 |
| 2001/0003364 A1 | * | 6/2001 | Sugawara et al. ........... 257/192 |
| 2001/0018245 A1 | * | 8/2001 | Kimizuka ................... 438/241 |
| 2001/0039093 A1 | * | 11/2001 | Oohashi ...................... 438/275 |
| 2001/0045582 A1 | * | 11/2001 | Schmidt et al. ............. 257/269 |
| 2001/0048119 A1 | * | 12/2001 | Mizuno et al. ............. 257/192 |
| 2001/0053579 A1 | * | 12/2001 | Toda et al. ................. 438/275 |
| 2002/0008289 A1 | * | 1/2002 | Murota et al. ............. 257/369 |
| 2002/0022376 A1 | * | 2/2002 | Oh ............................. 438/770 |
| 2002/0105041 A1 | * | 8/2002 | Goto et al. ................. 257/410 |
| 2002/0140031 A1 | * | 10/2002 | Rim ........................... 257/347 |
| 2002/0160584 A1 | * | 10/2002 | Kanzawa et al. ........... 438/478 |
| 2002/0185686 A1 | * | 12/2002 | Christiansen et al. ....... 257/347 |
| 2003/0003679 A1 | * | 1/2003 | Doyle et al. ................ 438/406 |

FOREIGN PATENT DOCUMENTS

| | | |
|---|---|---|
| EP | 0 114 491 | 12/1983 |
| EP | 0 256 363 | 2/1988 |

OTHER PUBLICATIONS

Maiti et al., "Topical Review, Strained–Si heterostructure field effect transistors", 1998, Semiconductor Science Technology vol. 13, pp. 1225–1246.*

Welser et al. "Strain Dependence of the Performance Enhancement in Strained–Si n–MOSFETs", 1994IEDM Tech. Dig., pp. 373–376.*

* cited by examiner

Primary Examiner—George Fourson
(74) Attorney, Agent, or Firm—Hurwitz & Thibeault, LLP

(57) ABSTRACT

A method is disclosed for forming multiple gate insulators on a strained semiconductor heterostructure as well as the devices and circuits formed therefrom. In an embodiment, the method includes the steps of depositing a first insulators on the strained semiconductor heterostructure, removing at least a portion of the first insulators from the strained semiconductor heterostructure, and depositing a second insulators on the strained semiconductor heterostructure.

24 Claims, 7 Drawing Sheets

METHOD OF FORMING MULTIPLE GATE INSULATORS ON A STRAINED SEMICONDUCTOR HETEROSTRUCTURE

The present application claims priority to U.S. Provisional Patent Application Ser. No. 60/296,617 filed Jun. 7, 2001.

BACKGROUND OF THE INVENTION

The present invention generally relates to the fabrication of semiconductor devices from substrates, and relates in particular to the use of strained silicon (Si) heterostructure substrates in forming devices such as transistors for example for high-performance CMOS integrated circuit products.

As microelectronic devices require faster operating speeds and increased computing power, the need exists for transistor circuits to provide a greater complexity of transistors in a smaller amount of circuit real estate. Such microelectronic devices include, for example, microprocessors, ASICs, embedded controllers, and FPGAs. Each microelectronic device consists of millions of transistors, such as metal oxide semiconductor field-effect transistors (MOSFETs), that are designed to provide control over both the directional flow of electrons and the speed at which the electrons move through the circuits.

MOSFETs are conventionally fabricated on Si substrates, which are the basic starting substrates on which semiconductor circuits are built. In order to create a MOSFET device on a Si substrate, a very thin layer of insulator is thermally grown or deposited on the Si substrate followed by a polysilicon gate electrode definition to create a MOSFET device. Typically this insulator is $SiO_2$, or $SiO_2$ with a significant fraction of nitrogen, and so the insulator is typically referred to as the gate oxide. The thickness of the gate oxide can determine the threshold voltage that must be applied to the gate of a MOSFET to turn on the MOSFET device. The gate oxide thickness is used to define the MOSFET application. For example, high-performance microprocessors have core logic devices with ultra-thin (e.g., 10–20 Å) gate oxides and input/output devices with thicker gate oxides (e.g., 20–100 Å). As the operational speed of electrical systems has increased, it has become necessary to have MOSFET devices with different gate oxide thicknesses on the same chip.

Conventional oxidation techniques for thermally growing oxide layers on a Si substrate typically involve the consumption of a significant portion of the Si substrate. For example, the amount of Si substrate that is lost in the oxidation process may be approximately one half of the thickness of the resulting thermally grown oxide layer.

Strained silicon heterostructures provide semiconductor devices with enhanced electron mobility and therefore speed. For example, see U.S. Pat. No. 5,442,205. Strained silicon heterostructure substrates typically include a relatively thin (e.g., less than 250 Å) strained silicon layer that may be used as the channel in a MOSFET device. If the layer of strained silicon is grown too thick, misfit dislocation defects will occur in the layer, compromising the yield (percentage of functional devices) when MOSFET circuits are fabricated on the substrate. In particular, at a critical thickness, dislocations are favored for strain relief of the epitaxial film over continued accumulation of strain energy. The critical thickness is a function of the lattice mismatch between the epitaxial film and substrate, as well as the materials properties of both the epitaxial layer and the substrate. It is this critical thickness that may limit the useful strained silicon film thickness to less than, e.g., 250 Å.

If too much of the strained silicon layer is consumed in the oxidation process, then the layer will be too thin to obtain the benefits of the enhanced electron mobility. The minimum strained silicon film thickness required for significant mobility enhancement is approximately 50 Å. Conventional methods of forming multiple gate oxides do not work well on a strained Si substrate since the strained Si cap layer may be too thin to support the formation of both thick and thin gate oxides. This is particularly the case since during a typical MOSFET fabrication process, there is much additional strained Si consumption due to various processing steps (cleans, thermal oxidations, anneals).

There is a need, therefore, for a method of forming strained silicon heterostructure substrates having a plurality of gate oxide thicknesses without sacrificing the enhance electron mobility of the substrates.

SUMMARY OF THE INVENTION

The invention provides a method for forming multiple gate insulators on a strained semiconductor heterostructure as well as the devices and circuits formed therefrom. In an embodiment, the method includes the steps of depositing a first insulator on the strained semiconductor heterostructure, removing at least a portion of the first insulator from the strained semiconductor heterostructure, and thermally growing or depositing a second insulator on the strained semiconductor heterostructure.

In an embodiment, the method of forming multiple gate insulators on a strained silicon heterostructure includes the steps of depositing a first insulator on the strained silicon heterostructure, applying a first photoresist mask to at least a portion of the strained silicon heterostructure, removing at least a first portion of the first insulator from the strained silicon heterostructure, and thermally growing or depositing a second insulator on the strained semiconductor heterostructure. In further embodiments, the method further includes the steps of applying a second photoresist mask to at least a portion of the strained silicon heterostructure, removing at least a second portion of the second insulator from the strained silicon heterostructure, and thermally growing or depositing a third insulator on the strained silicon heterostructure.

BRIEF DESCRIPTION OF THE DRAWINGS

The following description may be further understood with reference to the accompanying drawing in which.

The drawings are shown for illustrative purposes and are not to scale.

DETAILED DESCRIPTION OF THE INVENTION

A strained Si substrate is generally formed by providing a relaxed SiGe layer on bulk Si through either eptitaxial deposition or wafer bonding, and then providing a Si layer on the relaxed SiGe layer. Because SiGe has a different lattice constant than Si, the Si layer becomes "strained" and results in enhanced mobilities (and hence improved device speeds) compared with bulk Si. The percentage of Ge in the SiGe can have a dramatic effect on the characteristics of the strained Si layer.

Figure 1:
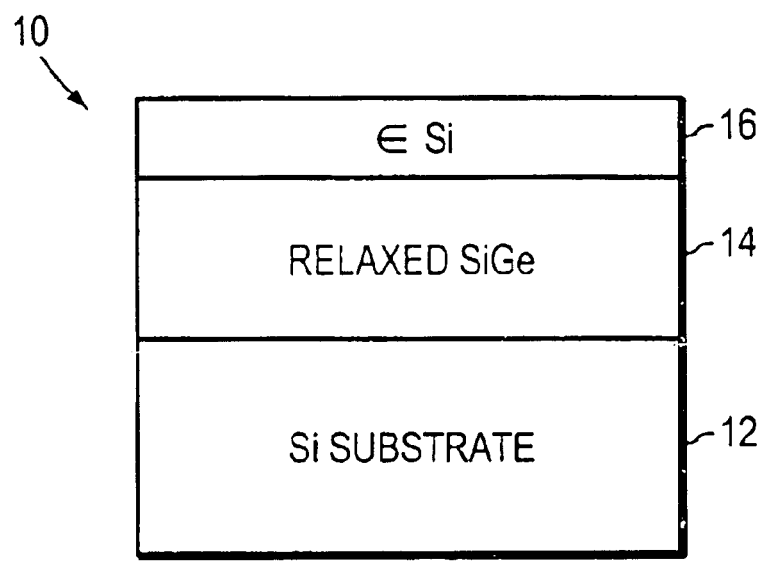
FIGS. 1–4 show diagrammatic views of a heterostructure substrate during a method of providing a plurality of gate insulator thicknesses in accordance with an embodiment of the invention.

The invention provides a method of forming multiple gate insulators on a substrate that includes strained semiconductor layers (e.g., strained silicon), where the thin and thick gate insulators are used for MOSFET transistors with different functionality. The resulting substrate allows the integration of MOSFETs with varying gate insulator thicknesses, using strained semiconductor layers to increase speed and mobility of devices built on the substrate. An illustrative example of such a substrate comprises a strained Si layer on a relaxed SiGe layer. FIG. 1 shows a cross-sectional view of a substrate 10, comprising a Si layer 12, a relaxed SiGe layer 14, and a strained Si surface layer 16. The strained Si layer 16 may be between 100 Å and 300 Å, and is preferably less than 250 Å in thickness. The substrate 10 forms the base structure for the present invention. In developing this layered heterostructure substrate 10, epitaxial growth techniques and polishing techniques (for example, chemical mechanical polishing) or wafer bonding techniques, which are known in the art, are applied. Methods of fabricating various strained silicon heterostructures are disclosed in U.S. patent application Ser. No. 09/906,551 filed Jul. 16, 2001 and U.S. patent application Ser. No. 09/928,126 filed Aug. 10, 2001, the disclosures of which are hereby incorporated by reference.

Figure 2:
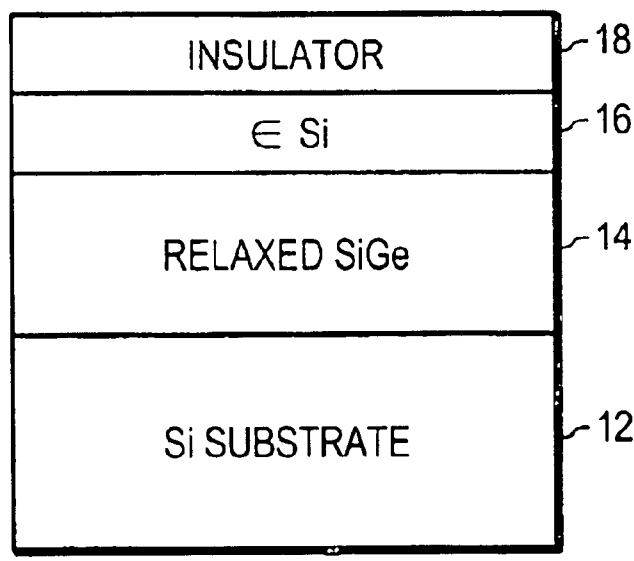

As shown in FIG. 2, an insulator layer 18 (e.g., $SiO_2$) is deposited on the strained Si layer 16, for example via Chemical Vapor Deposition (CVD) or other methods to a thickness of e.g., 50 Å. Insulator layer 18 may include a thin (approx. 10 Å) thermal oxide layer at the interface with strained Si layer 16, which may be grown before or after the deposition of insulator layer 18.

Figure 3:
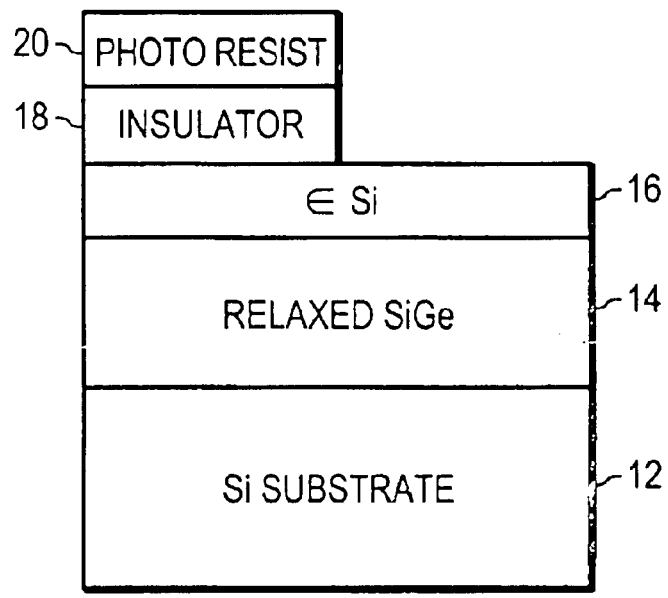

A photoresist masking layer 20 is then applied to a portion of the insulator layer 18 using photolithography techniques known in the art. The exposed portion of the insulator layer 18 is then removed using, e.g., an HF acid or a $CF_4/O_2$ step, leaving photoresist masking layer 20 and insulator layer 18 as shown in FIG. 3. The photoresist masking layer 20 is subsequently removed via wet etch (e.g., $H_2SO_4+H_2O_2$) or dry etch (e.g., oxygen plasma).

Figure 4:
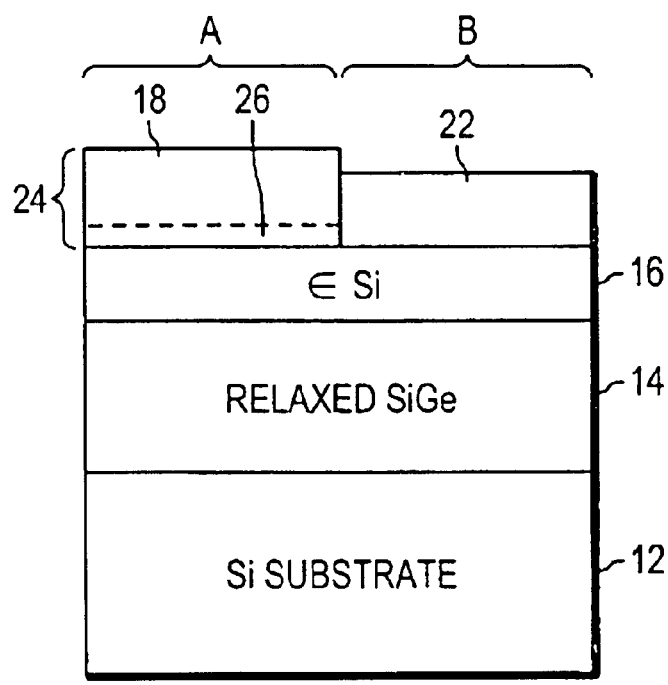

A second insulator layer 22 is then formed on the substrate by, e.g., thermal oxidation or deposition to a thickness of e.g., 10–20 Å as shown at part B in FIG. 4. When the second insulator layer 22 is formed, an oxide layer may be formed at the interface between the strained silicon layer 16 and the insulator layer 18 as shown at 26. Although the portion of the second insulator layer 26 in area designated part A may be thinner then the portion of second insulator layer 22 in area designated part B, the combined thickness of the insulator layer 18 and the insulator region 26 provide a composite insulator layer 24 as shown that is thicker than the thickness of the insulator layer 22. In particular, the composite insulator layer 24 may be greater than e.g., 70 Å in thickness and the insulator layer 22 may be 10–20 Å. The substrate may be used, therefore, to form MOSFETs having multiple gate insulator thicknesses.

Figure 5:
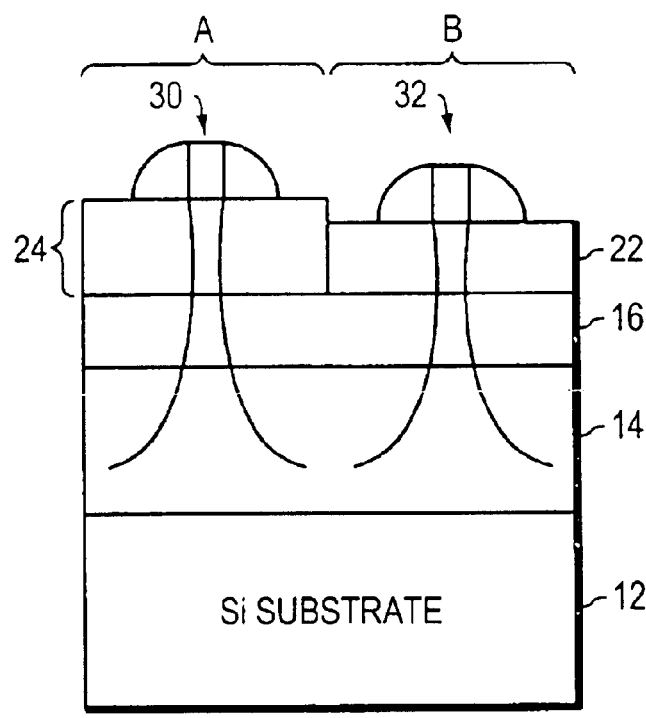
FIG. 5 shows a pair of FET devices formed on the substrate of FIG. 4 where each device includes a different gate insulator thickness.
Figure 6:
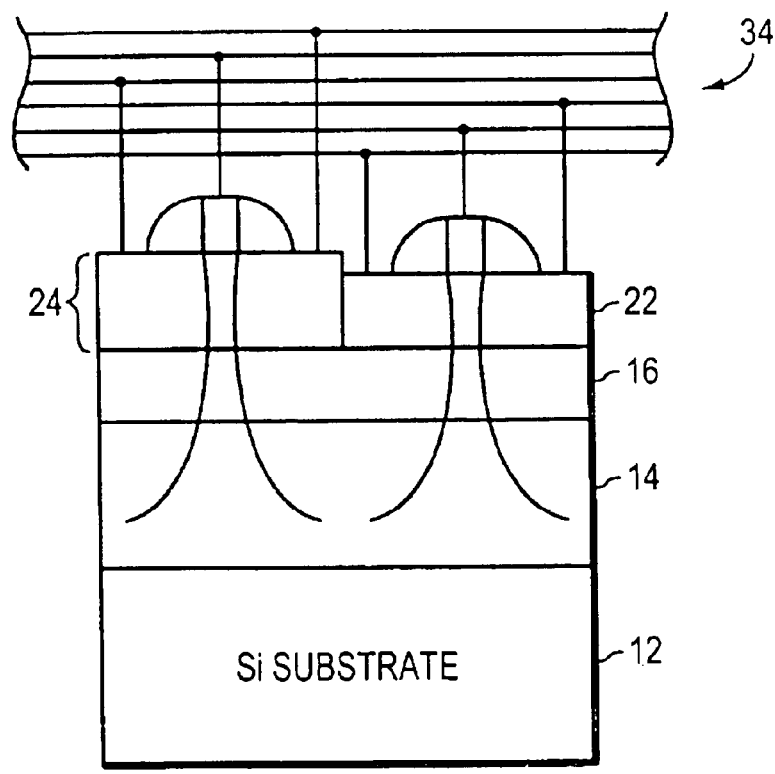
FIG. 6 shows the pair of FET devices of FIG. 5 coupled to a circuit.

As shown in FIG. 5, a pair of FET devices 30 and 32 may be formed on the parts A and B respectively of the structure of FIG. 4. The FET device 30 will include a gate insulator layer that is comprised of the composite insulator layer 24, and the FET device 32 will include a gate insulator layer that is comprised of the insulator layer 22. The devices each include strained silicon channel 16 of a sufficient thickness that the mobility of the electrons is not compromised. The devices may be isolated from one another as disclosed in U.S. Provisional Patent Application Ser. No. 60/296,976 filed Jun. 8, 2001 and U.S patent application Ser. No. 10/165,03 1, filed Jun. 7, 2002, the disclosures of which are both hereby incorporated by reference. The devices 30 and 32 may be coupled to a circuit as shown in FIG. 6 in which the gate, source and drain of each FET are coupled to conductive paths of a circuit as generally shown at 34.

Figure 7:
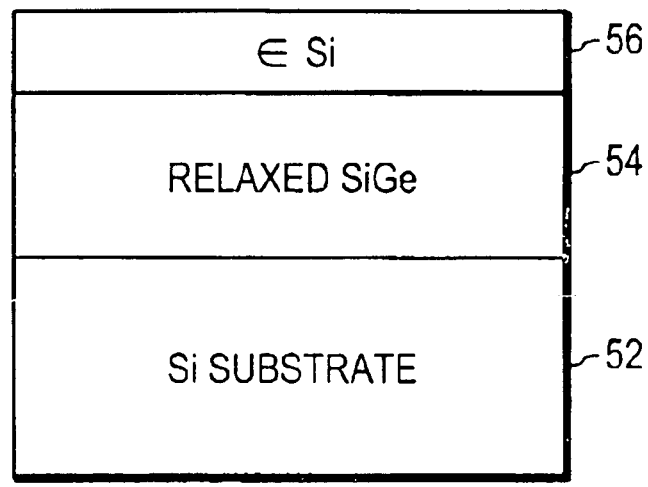
FIGS. 7–11 show diagrammatic views of a heterostructure substrate during a method of providing a plurality of gate insulator thicknesses in accordance with a further embodiment of the invention.
Figure 8:
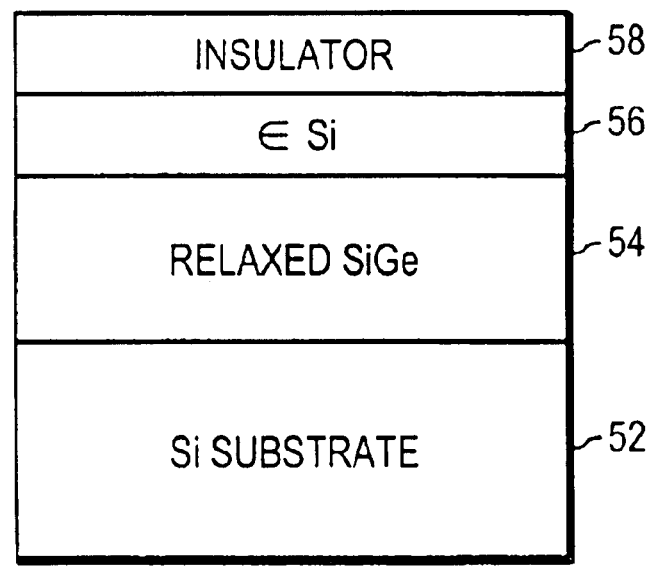
Figure 9:
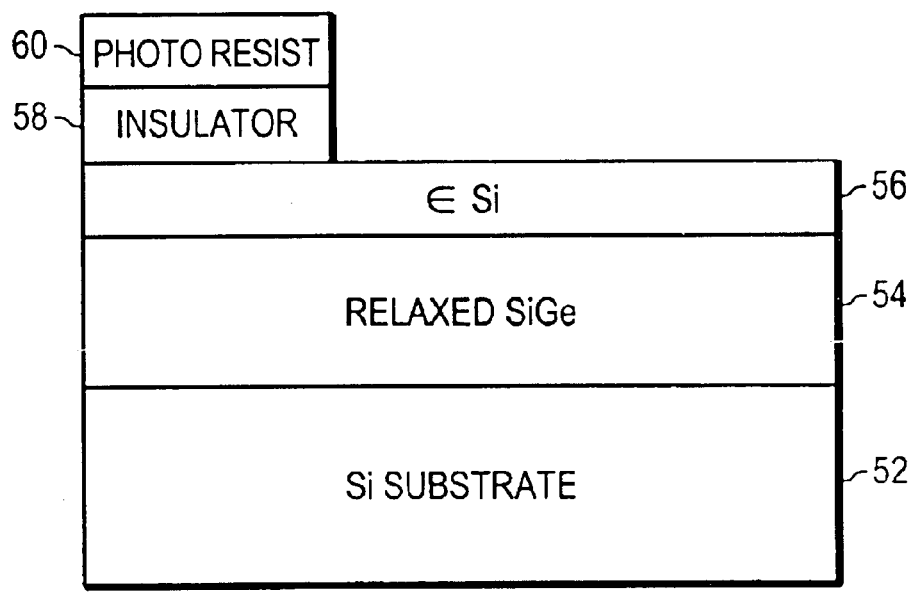

As shown in FIGS. 7–9 a heterostructure substrate 50 may again be formed of a silicon substrate 52, a relaxed layer 54 of SiGe and a strained silicon layer 56 in accordance with another embodiment of the invention similar to the above disclosed embodiment shown in FIGS. 1–3. An insulator layer 58 of e.g., $SiO_2$ is then deposited on the strained Si layer 56 via CVD, as shown in FIG. 8, to a thickness of e.g., 30 Å. A photoresist masking layer 60 is then applied to a portion of the insulator layer 58 using photolithography techniques known in the art. The exposed portion of the insulator layer 58 is then removed using HF acid or a $CF_4/O_2$ step, leaving photoresist masking layer 60 and insulator layer 58 as shown in FIG. 9. The photoresist masking layer 60 is subsequently removed via wet etch (e.g., $H_2SO_4+ H_2O_2$) or dry etch (e.g., oxygen plasma).

Figure 10:
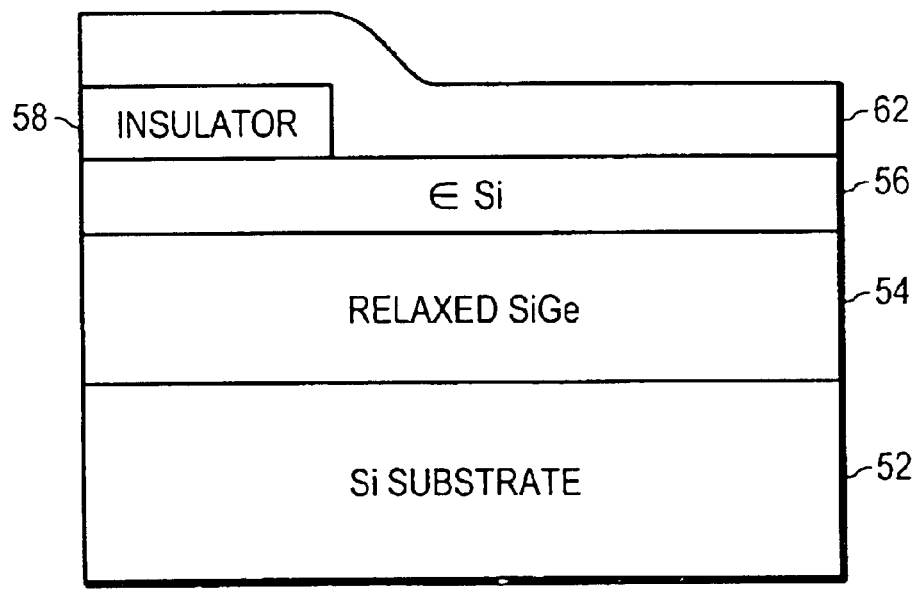
Figure 11:
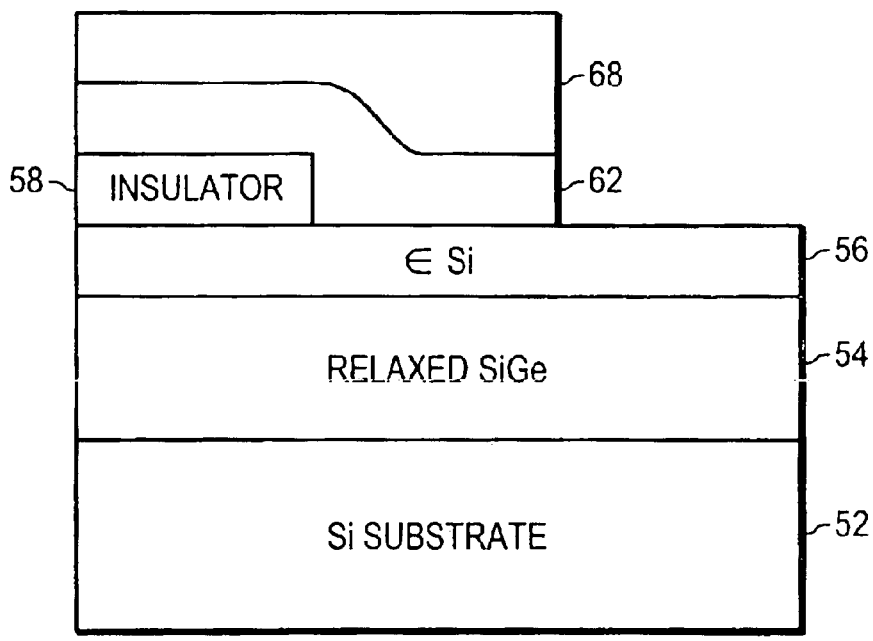

As shown in FIG. 10, a second insulator layer 62 is then deposited via CVD on the substrate on both the insulator layer 58 and the exposed portion of the strained silicon layer 56. The thickness of the second insulator layer 62 is, e.g., 30 Å. A second photoresist mask 68 is then applied to a portion of the substrate and the exposed portion of the insulator layer 62 is then removed using HF acid or a $CF_4/O_2$ step, leaving photoresist masking layer 68 and insulator layers 62 and 58 as shown in FIG. 11. The photoresist masking layer 68 is subsequently removed via wet etch (e.g., $H_2SO_4+H_2O_2$) or dry etch (e.g., oxygen plasma).

Figure 12:
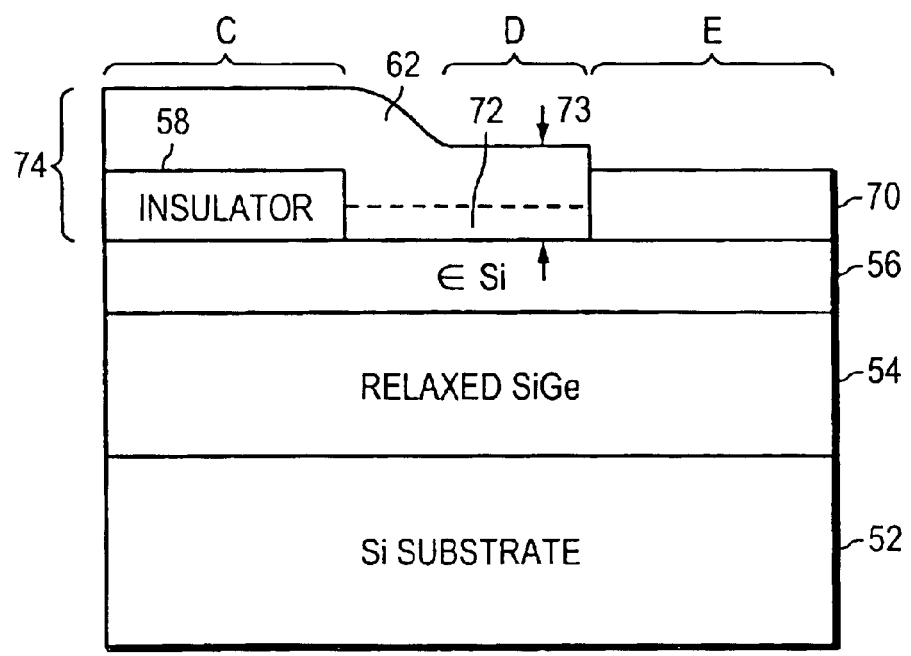
FIG. 12 shows three FET devices formed on the substrate of FIG. 11 where each device includes a different gate insulator thickness.

A third insulator layer 70 is then formed on the substrate e.g., by thermal oxidation or deposition to a thickness of e.g., 10–20 Å as shown at part E in FIG. 12. When the third insulator layer 70 is formed, the insulator layer 66 may also be grown at the interface between the strained silicon layer 56 and the insulator layer 58 as shown at part C, and an insulator layer 72 is formed at the interface with the strained silicon layer 56 as shown at part D. The combined thickness of the insulator layer 58, the insulator region 66 and the second insulator layer 62 provide a composite insulator layer 74 as shown that is larger than the thickness of the composite insulator layer 72 formed by the insulator layer 62 and the insulator layer 72. Each of these composite insulator layers 74 and 72 is thicker than the insulator layer 70 as shown at part E in FIG. 12. The substrate may be used, therefore, to form MOSFETs having three different gate insulator thicknesses.

Figure 13:
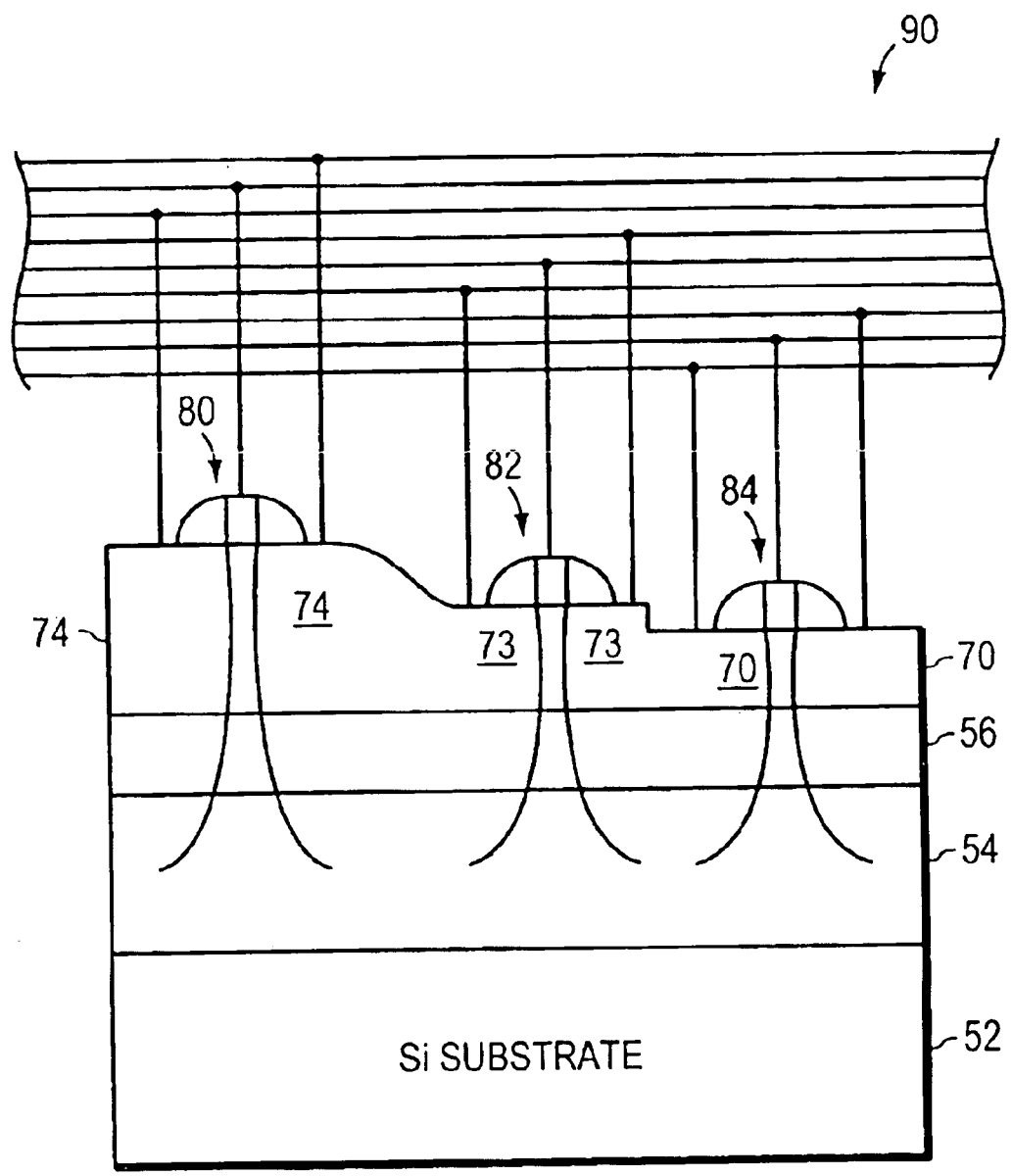
FIG. 13 shows the three FET devices of FIG. 12 coupled to a circuit.

As shown in FIG. 13, three FET devices 80, 82 and 84 may be formed on the parts C, D and E respectively of the structure of FIG. 12. The FET device 80 will include a gate insulator layer that is comprised of the composite insulator layer 74, the FET device 82 will include a gate insulator layer that is comprised of the composite insulator layer 72, and the FET device 84 will include a gate insulator layer that is comprised of the insulator layer 70. The devices each include strained silicon channel 56 of a sufficient thickness that the mobility of the electrons is not compromised. The devices maybe isolated from one another as disclosed in U.S. Provisional Patent Application Ser. No. 60/296,976 filed Jun. 8, 2001 and U.S. patent application Ser. No. 10/165,031, filed Jun. 7, 2002. The devices may be coupled to a circuit as shown in FIG. 13 in which the gate, source and drain of each FET are coupled to conductive paths of a circuit as generally shown at 90. The substrate may be used, therefore, to form MOSFETs having more than two multiple gate insulator thicknesses.

The invention may also include one or more of the following elements: relaxed SiGe layer 14 may comprise strained or relaxed semiconductor layers other than SiGe, for example Ge or GaAs; strained Si surface layer 16 may comprise strained SiGe or Ge layers; strained Si layer 16 may be above the critical thickness; and the substrate 10 may comprise an insulating layer such as SiO.sub.2, thus making the relaxed SiGe layer 14 optional. Those skilled in the art will appreciate that numerous modifications and variations may be made to the above disclosed embodiments without departing from the spirit and scope of the invention.

What is claimed is:

1. A method of forming multiple gate insulators, said method comprising the steps of:

providing a heterostructure comprising a strained semiconductor layer;

forming a first insulator layer having a first thickness over said heterostructure by growing an intermediate insulator layer by thermal oxidation and increasing a thickness of said intermediate insulator layer to said first thickness by deposition;

removing said first insulator layer in a region; and forming a second insulator layer having a second thickness in said region, said second thickness being less than said first thickness; wherein a thickness of said strained semiconductor layer is substantially unchanged following the formation of said insulator layers.

2. The method as claimed in claim 1, wherein said thickness of said intermediate insulator layer is increased to said first thickness by chemical vapor deposition.

3. The method as claimed in claim 1, wherein said step of forming a second insulator layer comprises chemical vapor deposition.

4. The method as claimed in claim 1, wherein said step of forming a second insulator layer comprises thermal oxidation.

5. The method as claimed in claim 1 wherein the thickness of said strained semiconductor layer is greater than approximately 50 Å.

6. The method as claimed in claim 1, wherein said first thickness ranges from approximately 20 Å to approximately 100 Å.

7. The method as claimed in claim 1, wherein said second thickness ranges from approximately 10 Å to approximately 20 Å.

8. The method as claimed in claim 1, wherein a thickness of said intermediate insulator layer does not exceed approximately 10 Å.

9. A method of forming a semiconductor structure having multiple gate insulators, said method comprising the steps of:

providing a heterostructure comprising a strained semiconductor layer;

forming a plurality of insulator layers over said strained semiconductor layer, each insulator layer having a different thickness, wherein the thickness of said strained semiconductor layer is substantially unchanged following the formation of said plurality of insulator layers, the step of forming a plurality of insulator layers comprising:

forming a first insulator layer having a first thickness over said heterostructure by growing an intermediate insulator layer by thermal oxidation and increasing a thickness of said intermediate insulator layer to said first thickness by deposition; and forming a plurality of semiconductor devices disposed over said strained semiconductor layer, each device comprising an insulator layer of said plurality of insulator layers.

10. The method as claimed in claim 9, wherein said thickness of said intermediate insulator layer is increased to said first thickness by chemical vapor deposition.

11. The method as claimed in claim 9, wherein the thickness of said strained semiconductor layer is greater than approximately 50 Å.

12. The method as claimed in claim 9, wherein said first thickness ranges from approximately 20 Å to approximately 100 Å.

13. The method as claimed in claim 9, wherein said second thickness ranges from approximately 10 Å to approximately 20 Å.

14. The method as claimed in claim 9, wherein said method further comprises forming a third insulator having a third thickness in a third region of said strained semiconductor layer, said second thickness being greater than said third thickness.

15. The method as claimed in claim 9, wherein the strained semiconductor layer comprises Si.

16. The method as claimed in claim 9, wherein the thickness of said strained semiconductor layer is less than approximately 300 Å.

17. The method as claimed in claim 9, wherein the plurality of insulator layers comprises silicon dioxide.

18. The method as claimed in claim 9, wherein said heterostructure further comprises a relaxed semiconductor layer disposed at least partially underneath said strained semiconductor layer.

19. The method as claimed in claim 18, wherein said relaxed semiconductor layer comprises SiGe, Ge, or GaAs.

20. The method as claimed in claim 1, wherein the strained semiconductor layer comprises Si.

21. The method as claimed in claim 1, wherein the thickness of said strained semiconductor layer is less than approximately 300 Å.

22. The method as claimed in claim 1, wherein the plurality of insulator layers comprises silicon dioxide.

23. The method as claimed in claim 1, wherein said heterostructure further comprises a relaxed semiconductor layer disposed at least partially underneath said strained semiconductor layer.

24. The method as claimed in claim 1, wherein said relaxed semiconductor layer comprises SiGe, Ge, or GaAs.

* * * * *